(12) United States Patent
Mack et al.

(10) Patent No.: US 6,724,584 B2
(45) Date of Patent: Apr. 20, 2004

(54) DATA HEAD AND METHOD USING A SINGLE ANTIFERROMAGNETIC MATERIAL TO PIN MULTIPLE MAGNETIC LAYERS WITH DIFFERING ORIENTATION

(75) Inventors: Anthony M. Mack, Minneapolis, MN (US); Zheng Gao, Bloomington, MN (US); Nurul Amin, Burnsville, MN (US); Sining Mao, Savage, MN (US); Richard Michel, Minneapolis, MN (US)

(73) Assignee: Seagate Technology LLC, Scotts Valley, CA (US)

( * ) Notice: Subject to any disclaimer, the term of this patent is extended or adjusted under 35 U.S.C. 154(b) by 0 days.

(21) Appl. No.: 10/152,192

(22) Filed: May 20, 2002

(65) Prior Publication Data

US 2002/0131219 A1 Sep. 19, 2002

Related U.S. Application Data

(62) Division of application No. 09/500,778, filed on Feb. 8, 2000, now Pat. No. 6,469,878.
(60) Provisional application No. 60/119,772, filed on Feb. 11, 1999.

(51) Int. Cl.[7] .............................................. G11B 5/39
(52) U.S. Cl. .............................. 360/324.12; 360/324.11
(58) Field of Search ...................... 360/324.1, 324.11, 360/324.12, 324.2

(56) References Cited

U.S. PATENT DOCUMENTS

| | | | |
|---|---|---|---|
| 4,949,039 A | 8/1990 | Grünberg | 324/252 |
| 5,206,590 A | 4/1993 | Dieny et al. | 324/252 |
| 5,390,061 A | 2/1995 | Nakatani et al. | 360/113 |
| 5,475,304 A | 12/1995 | Prinz | 324/207.21 |
| 5,528,440 A * | 6/1996 | Fontana et al. | 360/324.12 |
| 5,534,355 A | 7/1996 | Okuno et al. | 428/611 |
| 5,576,915 A | 11/1996 | Akiyama et al. | 360/113 |
| 5,583,725 A | 12/1996 | Coffey et al. | 360/113 |
| 5,616,370 A | 4/1997 | Okuno et al. | 427/547 |
| 5,650,887 A | 7/1997 | Dovek et al. | 360/75 |
| 5,686,838 A | 11/1997 | van den Berg | 324/252 |
| 5,688,605 A | 11/1997 | Iwasaki et al. | 428/611 |
| 5,696,655 A | 12/1997 | Kawano et al. | 360/113 |

(List continued on next page.)

OTHER PUBLICATIONS

"Linearity of Unshielded Spin–Valve Sensors", by N. Sugaware et al., American Institute of Physics, Jan. 27, 1997, pp. 523–525.

"AMR Effect in Spin–Valve Structure", by Y. Uehara et al., IEEE Transactions on Magnetics, vol. 32, No. 5, Sep. 1996, pp. 3432–3433.

"Thermal Fluctuation Aftereffect of Exchange Coupled Films for Spin Valve Devices", by J. Fujikata, K. Hayashi, H. Yamamoto and M. Nakada, J. Appl. Phys., vol. 83, No. 11, Jun. 1, 1998, American Institute of Physics, pp. 7210–7212.

(List continued on next page.)

Primary Examiner—David L. Ometz
(74) Attorney, Agent, or Firm—Westman, Champlin & Kelly, P.A.

(57) ABSTRACT

Methods of fabricating spin valve sensors in accordance with the invention include forming a pinning layer from an antiferromagnetic material and forming a synthetic antiferromagnet adjacent the pinning layer. A free ferromagnetic layer is formed, and exchange tabs are formed adjacent outer portions of the free ferromagnetic layer for biasing the free layer. The exchange tabs are formed from the same antiferromagnetic material as the first pinning layer. Then, the magnetic moments of the synthetic antiferromagnet are set, and the magnetic moment of the free ferromagnetic layer is biased, during a single anneal in the presence of a single magnetic field.

18 Claims, 6 Drawing Sheets

U.S. PATENT DOCUMENTS

| | | | |
|---|---|---|---|
| 5,696,656 A | | 12/1997 | Gill et al. .................... 360/113 |
| 5,701,223 A | * | 12/1997 | Fontana, Jr. et al. ..... 360/324.11 |
| 5,702,832 A | | 12/1997 | Iwasaki et al. ............. 428/611 |
| 5,705,973 A | | 1/1998 | Yuan et al. ................ 338/32 R |
| 5,717,550 A | | 2/1998 | Nepela et al. ............... 360/113 |
| 5,725,963 A | | 3/1998 | Iwasaki et al. ............. 428/611 |
| 5,738,946 A | | 4/1998 | Iwasaki et al. ............. 428/611 |
| 5,739,988 A | | 4/1998 | Gill ........................... 360/113 |
| 5,739,990 A | * | 4/1998 | Ravipati et al. ........ 360/324.12 |
| 5,742,162 A | | 4/1998 | Nepela et al. ............... 324/252 |
| 5,751,521 A | | 5/1998 | Gill ........................... 360/113 |
| 5,756,191 A | | 5/1998 | Hashimoto et al. .......... 428/209 |
| 5,764,056 A | | 6/1998 | Mao et al. ................... 324/252 |
| 5,768,066 A | | 6/1998 | Akiyama et al. ............ 360/113 |
| 5,768,069 A | | 6/1998 | Mauri ........................ 360/113 |
| 5,880,913 A | | 3/1999 | Gill ............................ 360/112 |
| 5,883,764 A | | 3/1999 | Pinarbasi .................... 360/113 |
| 6,185,078 B1 | * | 2/2001 | Lin et al. ............... 360/324.12 |
| 6,201,671 B1 | | 3/2001 | Pinarbasi .................. 360/324.1 |
| 6,262,869 B1 | | 7/2001 | Lin et al. .................. 360/324.1 |
| 6,282,069 B1 | | 8/2001 | Nakazawa et al. ....... 360/324.2 |
| 6,295,186 B1 | * | 9/2001 | Hasegawa et al. ..... 360/324.11 |
| 6,302,970 B1 | | 10/2001 | Shimazawa et al. ......... 148/108 |
| 6,364,964 B1 | | 4/2002 | Sasaki et al. ............... 148/121 |
| 6,469,879 B1 | * | 10/2002 | Redon et al. ............ 360/324.2 |

OTHER PUBLICATIONS

"NiMn–Pinned Spin Valves with High Pinning Field Made by Ion Beam Sputtering", by S. Mao, S. Gangopadhyay, N. Amin and E. Murock, Appl. Phys. Lett., vol. 69, No. 23, Dec. 2, 1996, American Institute of Physics, pp. 3593–3595.

"Temperature Dependence of Giant Magnetoresistance Properties of NiMn Pinned Spin Valves", by S. Mao, N. Amin and E. Murdock, Appl. Phys., vol. 83, No. 11, June 1, 1998, American Institute of Physics, pp. 6807–6809.

* cited by examiner

DATA HEAD AND METHOD USING A SINGLE ANTIFERROMAGNETIC MATERIAL TO PIN MULTIPLE MAGNETIC LAYERS WITH DIFFERING ORIENTATION

The present application is a divisional of and claims priority of U.S. patent application Ser. No. 09/500,778, filed Feb. 8, 2000, now U.S. Pat. No. 6,649,878 and claims priority to Provisional Application Serial No. 60/119,772, filed Feb. 11, 1999 and entitled METHOD OF USING A SINGLE ANTIFERROMAGNETIC MATERIAL TO PIN MULTIPLE MAGNETIC LAYERS WITH DIFFERING ORIENTATIONS, the contents of which are hereby incorporated by reference in their entirety.

BACKGROUND OF THE INVENTION

The present invention relates to data storage systems. More specifically, the present invention relates to data storage systems using read heads, which utilize multiple magnetic layers with differing magnetic orientations.

There is ever increasing demand for high data densities that require sensitive sensors to read data from a magnetic media. Advanced giant magnetoresistive (GMR) spin valve sensors that have increased sensitivity are replacing anisotropic magnetoresistive (AMR) sensors. A spin valve sensor consists of two soft magnetic layers separated by a thin conductive, non-magnetic spacer layer such as copper. An antiferromagnetic material (called the "pinning layer") is placed adjacent to the first soft magnetic layer to prevent it from rotating. Antiferromagnetic materials exhibiting this property are termed "pinning materials". With its rotation inhibited, the first soft layer is termed the "pinned layer". The second soft layer rotates freely in response to an external field and is called the "free layer". If the pinning layer is deposited before the free layer, the structure is called a "bottom spin valve" or "BSV". The layers can also be deposited in reverse order with the pinning layer on the top, in which case it is called a "top spin valve" or "TSV".

The sensor must be stabilized against the formation of edge domain walls because domain wall motion results in electrical noise, which makes data recovery impossible. A common way to achieve this is with a permanent magnet abutted junction design. In this scheme, permanent magnets with high coercive field (i.e., hard magnets) are placed at each end of the sensor. The field from the permanent magnets stabilizes the sensor and prevents edge domain formation, as well as provides proper bias.

Abutted junctions are difficult to engineer for the following reasons. To properly stabilize the sensor, the magnet must provide more flux than can be absorbed by the free layer. This undesirable extra flux stiffens the free layer near the edge of the sensor. The junction must be carefully engineered to minimize this stray flux as well as the junction resistance. Also, a junction of dissimilar metals can cause unwanted strain in the sensor. The free layer will respond to the strain unless the magnetostriction is exactly zero. Another disadvantage is the nature of hard magnetic materials, which are multi-domained. Variation in domain size and shape lead to a distribution of domain coercivity. Lower coercivity domains may rotate when subjected to external fields. Such a domain near the sensor edge could cause domain wall formation in the active sensor and failure.

An alternative method of stabilization is to use an "exchange tab" design. In this case, the free layer is overlaid with a pinning material layer, which pins it in the proper direction. This layer is called an "exchange tab layer," and it both protects against the formation of edge domains and helps bias the sensor properly. There are several advantages to the use of an exchange tab over abutted junction. There is no junction to produce stray magnetic flux or junction resistance. Also, the lack of a junction of abutted, dissimilar metals makes it less likely to produce high strain within the sensor.

The resistance of a spin valve sensor depends upon the relative angle between the magnetic moments of the free and pinned soft layers. To maximize the sensitivity and obtain a linear output signal, it is necessary to bias the free layer. An ideal bias condition is when the free layer is biased such that its magnetic moment is perpendicular to the magnetic moment of the pinned layer in the absence of an applied magnetic field. Since the pinned layer in the spin valve and outer portions of the free layer are preferably oriented perpendicular to each other, these magnetic orientations or pinning directions are typically established by separate thermal anneals, each in the presence of a differently oriented magnetic field. One method to achieve this is to choose pinning materials having differing blocking temperatures for pinning the pinned layer and for biasing the free layer. The pinning direction of the material with the higher blocking temperature is established first. A second anneal sets the pinning direction of the other material without affecting the first. A disadvantage of this approach is that there are few pinning materials with blocking temperature sufficiently high to use in a recording head. Rotation of the pinning direction can occur at temperatures near the blocking temperature, leading to long-term reliability issues. Use of a second material with lower blocking temperature reduces the sensor's thermal stability, since the lowest blocking temperature determines the maximum useable temperature.

SUMMARY OF THE INVENTION

Methods of fabricating spin valve sensors in accordance with the invention include forming a pinning layer from an antiferromagnetic material and forming a synthetic antiferromagnet adjacent the pinning layer. A free ferromagnetic layer is formed, and exchange tabs are formed adjacent outer portions of the free ferromagnetic layer for biasing the free layer. The exchange tabs are formed from the same antiferromagnetic material as the first pinning layer. Then, the magnetic moments of the synthetic antiferromagnet are set, and the magnetic moment of the free ferromagnetic layer is biased, during a single anneal in the presence of a single magnetic field.

DETAILED DESCRIPTION OF THE ILLUSTRATIVE EMBODIMENTS

Figure 1:
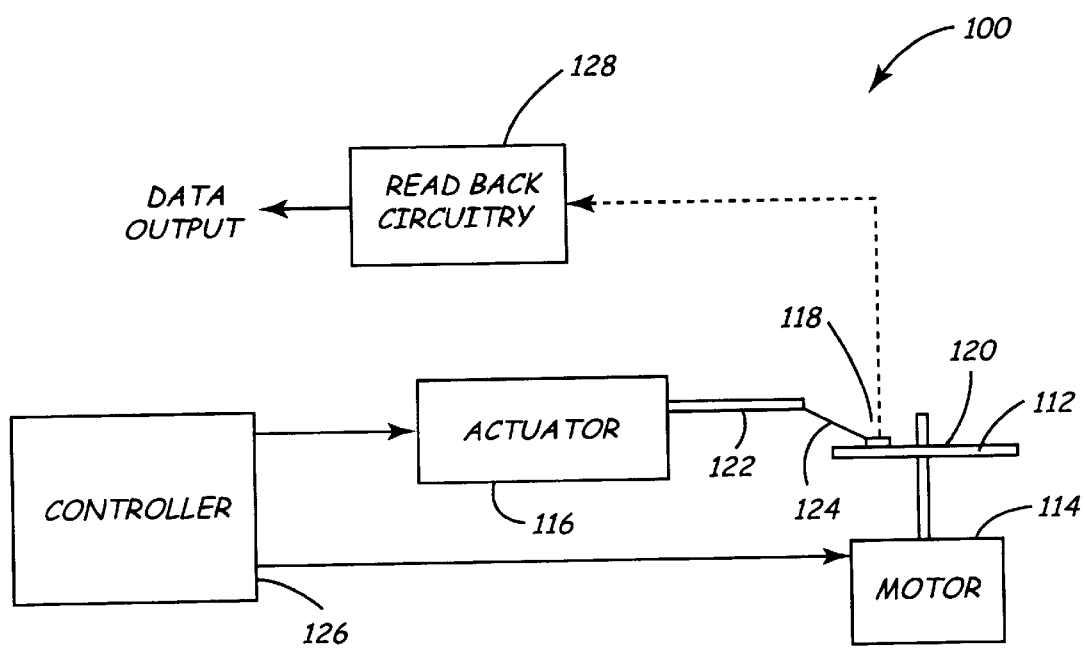
FIG. 1 is a simplified diagram of a storage system using a spin valve sensor in accordance with the present invention.

The present invention includes new giant magnetoresistive (GMR) spin valve sensors which may be used in a data storage system such as data storage system 100 shown in FIG. 1, as well as methods of fabricating the spin valve sensors. System 100 includes storage medium 112 such as a magnetic disc, which is rotated by motor 114. An actuator 116 is coupled to a slider 118 which is used to position a spin valve sensor (not shown in FIG. 1) or other types of magnetoresistive sensors over a surface 120 of disc 112. Actuator 116 includes actuator arm 122, which is attached to slider 118 via suspension 124. A controller 126 controls positioning of slider 118. The spin valve sensor operates by receiving a sense (or bias) current I from a current source on read back circuitry 128. Variations in a magnetic field applied to the sensor due to magnetization of disc 112 cause a change in the electrical resistance of the sensor. This change in electrical resistance is detected with readback circuitry 128 which responsively provides data output. Operation of spin valves is known in the art and is described, for example, in U.S. Pat. No. 4,949,039, issued Aug. 14, 1990 to Grunberg, which is hereby incorporated by reference.

Figure 2:
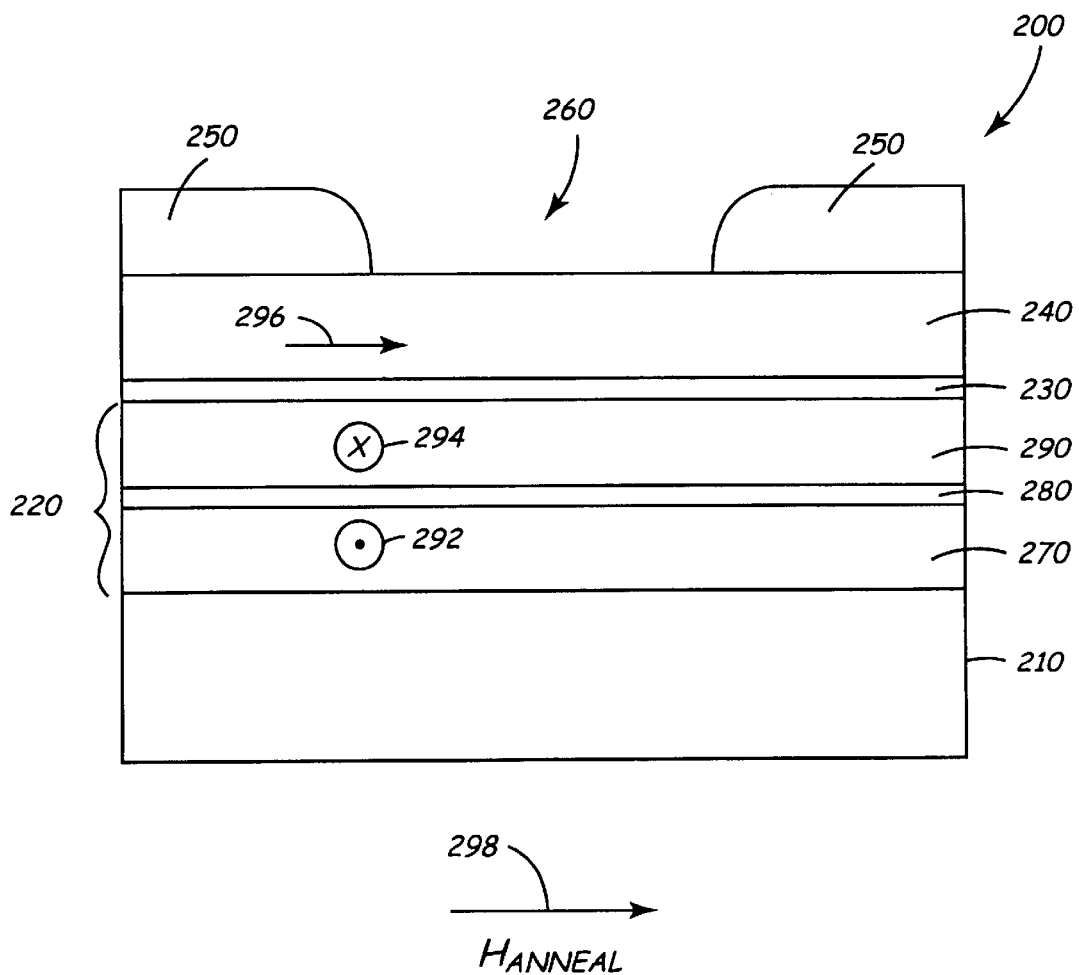
FIG. 2 is a diagrammatic air bearing surface view of a first spin valve sensor embodiment fabricated in accordance with the present invention.
Figure 3:
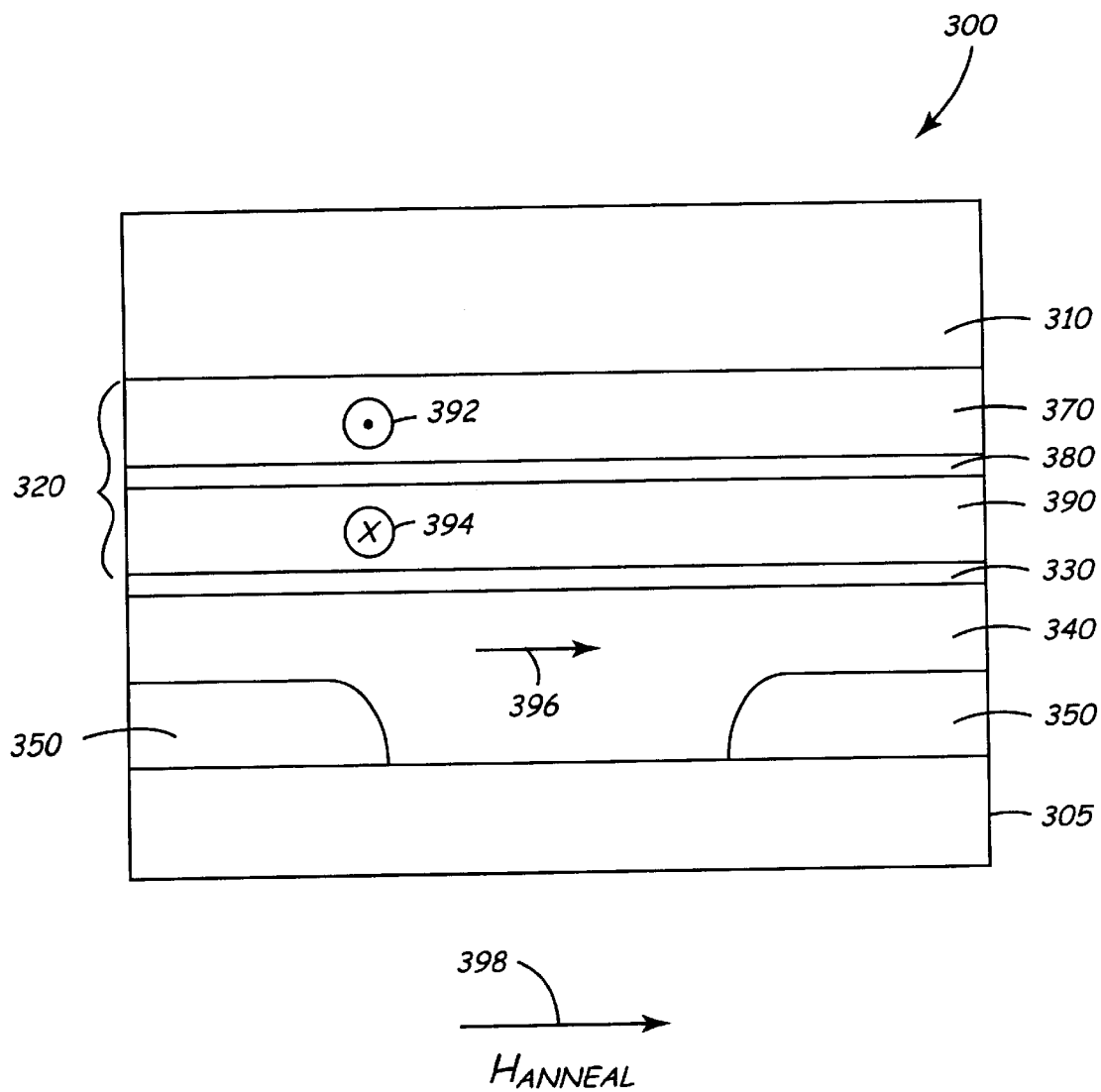
FIG. 3 is a diagrammatic air bearing surface view of a second spin valve sensor embodiment fabricated in accordance with the present invention.
Figure 4:
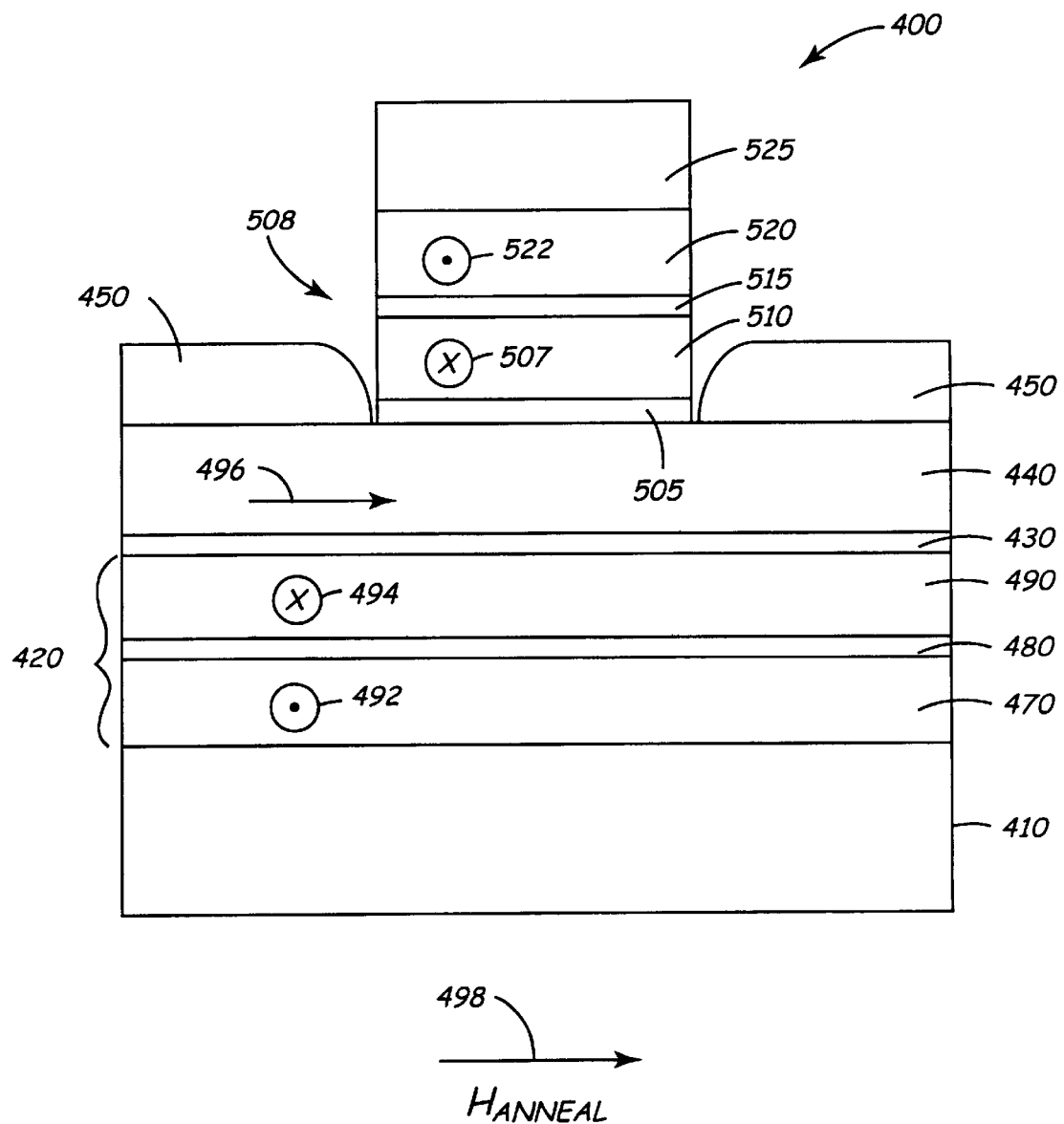
FIG. 4 is a diagrammatic air bearing surface view of a third spin valve sensor embodiment fabricated in accordance with the present invention.

FIGS. 2–4 are diagrammatic air bearing surface views of spin valve sensors 200, 300, and 400 in accordance with exemplary embodiments of the present invention. Sensors 200, 300, 400 and 500 are embodiments of sensors, which can be included on slider 118 (shown in FIG. 1). Sensor 200 illustrated in FIG. 2 includes antiferromagnetic pinning layer 210, synthetic antiferromagnet 220, spacer layer 230, free layer 240 and antiferromagnetic exchange tabs 250. Other layers or components of the type known in the art can also be included in spin valve 200, but are omitted from FIG. 2 to simplify the illustration. For example, spin valve 200 can include seed layers if desired. Further, although electrical contacts or leads are not shown in FIG. 2, those of skill in the art will recognize that electrical leads will be included in the spin valves of the present invention.

In order to increase the stiffness of the "pinned layer", the frequently utilized single layer is replaced by a "synthetic antiferromagnet" (SAF) 220 as is known in the art. SAF 220 includes two soft ferromagnetic layers 270 and 290, separated by an extremely thin metal spacer layer 280, which can be for example ruthenium. Layer 270 is often referred to as the "pinned layer" and is the layer adjacent to the antiferromagnetic pinning layer 210. Layer 290 is often referred to as the "reference layer", and is the layer closest to the free layer 240. The exchange coupling between pinned layer 270 and reference layer 290 is an oscillatory function of thickness of the metal spacer layer 280. For certain thickness, the coupling can be strongly antiferromagnetic. In this case, the two magnetic layers' magnetization vectors point in opposite directions (represented by reference directions 292 and 294) and therefore have a very small net magnetic moment. An external field exerts a torque proportional to the net moment, so this torque must in turn be small. The result is very stiff pinned layer 290 that does not readily respond to external fields.

The resistance of the sensor depends on $\theta$, the relative angle between magnetic moment 296 of the free layer and magnetic moment 294 of reference layer 290, wherein $R(\theta)=R_{min}+\Delta R(1-\cos\theta)/2$. There is an intrinsic exchange coupling between reference layer 290 and free layer 240 that makes it energetically favorable for the magnetic moment of the free layer to rotate parallel to the magnetic moment of the reference layer ($\theta=0$). In this configuration, the sensitivity is very low, since $dR/d\theta=0$. To maximize the sensitivity and obtain a linear output signal, it is desirable to properly "bias" the free layer. As discussed previously, the ideal bias condition is where the magnetic moment 296 of the free layer is perpendicular to the magnetic moment 294 of the reference layer because $dR/d\theta$ reaches its maximum value, of $\Delta R/2$.

In a SAF, the orientation of pinned layer 270 can be manipulated by variation of the relative thickness of pinned layer 270 and reference layer 290, and with the application of a magnetic field. For example, if pinned layer 270 is thinner than reference layer 290, and if the applied field is not too large, reference layer 290 will align with the field while pinned layer 270 will align antiparallel. In accordance with embodiments of the present invention, pinned layer 270 and reference layer 290 have similar thicknesses. Thus, both will rotate approximately perpendicular to the applied field, while free layer 240 orients parallel with the applied field. This makes it possible, with a single anneal in the presence of a magnetic field, to simultaneously establish pinning directions in the spin valve and in the exchange tabs which are perpendicular to each other. Since a single anneal can set both pinning layer 210 and exchange tabs 250, there is no necessity to use two different antiferromagnetic materials with dissimilar blocking temperatures.

Thus, in accordance with embodiments of the present invention, the thicknesses of pinned layer 270 and reference layer 290 of SAF layer 220 are substantially the same, and antiferromagnetic pinning layer 210 and antiferromagnetic exchange tabs 250 are made from the same material such that they each exhibit substantially the same blocking temperature. The result is that the orientation of the magnetic moments 292 and 294 of pinned and reference layers 270 and 290 can be pinned in directions antiparallel to one another, and the orientation of magnetic moment 296 of free layer 240 can be biased in a direction perpendicular to the magnetic moment of reference layer 290 with a single anneal in the presence of field $H_{ANNEAL}$ in direction 298.

In exemplary embodiments, AFM pinning layer 210 and AFM exchange tabs 250 are a manganese (Mn) based antiferromagnetic alloy. In some embodiments, nickel manganese (NiMn) is used for pinning layer 210 and exchange tabs 250. In these embodiments, the composition of the NiMn is usually between about 45 and 65 atomic percent Mn. However, in other embodiments, instead of NiMn, the pinning material used includes PtMn, RhMn, RuRhMn, CoO, NiO, $Fe_2O_3$ or other known pinning materials. In exemplary embodiments, pinning layer 210 and exchange tabs 250 are NiMn having a thickness of between about 80 Å and 300 Å. However, the present invention is not limited to a particular pinning material or pinning material thickness.

In exemplary embodiments, SAF 220 utilizes either Co, CoFe, or CoNiFe for pinned layer 270 and reference layer 290. For example, in one embodiment, layers 270 and 290 are layers of Co or CoFe having thicknesses between about 15 Å and 35 Å. However, other materials can be used as well. As discussed above, the thicknesses of layers 270 and 290 are preferably substantially the same. Metallic spacer layer 280 positioned between reference layer 290 and pinned layer 270 can be a variety of different materials. In some embodiments, spacer layer 280 is a layer of Ru having a thickness of between about 7 and 12 Å. Synthetic antiferromagnets are known in the art and are described, for example, in U.S. Pat. No. 5,583,725 to Coffey et al. which was used issued Dec. 10, 1996 and is entitled, "SPIN VALVE MAGNETORESISTIVE SENSOR WITH SELF-PINNED LAMINATED LAYER AND MAGNETIC RECORDING SYSTEM USING THE SENSOR."

Spacer layer 230 can be any of a wide variety of non-ferromagnetic materials. In an illustrative embodiment, spacer layer 230 is Cu, which has low electrical resistivity. By way of example, spacer layer 230 can be a layer of Cu having a thickness of about 33 Å. However, other non-ferromagnetic materials can be used for spacer layer 230, for example, Ag, Au, and CuX (where X is Ag, Ru or Rh, for example).

Free layer 240 is a ferromagnetic layer whose magnetization vector 296 is biased by exchange tabs 250, but remains unpinned such that, in the presence of a magnetic field to be sensed, the magnetization of free layer 240 is caused to rotate so that it is at least partially anti-parallel to the direction in which the magnetization vector of reference layer 290 is constrained. Free layer 240 can be a single or multi-layered structure. For example, free layer 240 can be a layer of NiFe or a bi-layer of NiFe/CoFe. Other ferromagnetic materials can be used for free layer 240 as is known in the art.

FIG. 3 is a diagrammatic air bearing surface view of a top spin valve 300 in accordance with an alternate embodiment of the present invention. Spin valve 300 includes antiferromagnetic pinning layer 310, synthetic antiferromagnet 320, spacer layer 330, free layer 340 and antiferromagnetic exchange tabs 350. Like spin valve 200 illustrated in FIG. 2, synthetic antiferromagnet 320 includes pinned layer 370, spacer layer 380 and reference layer 390. Also like spin valve 200, layers 370 and 390 of the synthetic antiferromagnet preferably have substantially identical thicknesses. Another similarity between spin valve 300 and spin valve 200 is that the material for antiferromagnetic pinning layer 310 and antiferromagnetic exchange tabs 350 is preferably the same.

Since spin valve 300 is a top spin valve, antiferromagnetic exchange tabs 350 and free layer 340 are formed on substrate 305 first. Then, after formation of spacer layer 330, synthetic antiferromagnet 320 and antiferromagnetic pinning layer 310 are formed. With the thicknesses of pinned layer 370 and reference layer 390 of synthetic antiferromagnet 320 being substantially the same, and with the same antiferromagnetic material used for pinning layer 310 and exchange tabs 350, the orientations directions 392, 394 and 396 of the magnetic moments of pinned layer 370, reference layer 390 and free layer 340 can be established with a single anneal in the presence of magnetic field $H_{ANNEAL}$ (in direction 398 parallel to direction 396). The materials and thicknesses of the various layers in spin valve 300 can be the same as those discussed above with reference to spin valve 200.

FIG. 4 is a diagrammatic air bearing surface view of spin valve 400 in accordance with yet other embodiments of the present invention. Spin valve 400 is a combination of a bottom spin valve and top spin valve, and is frequency referred to as a dual spin valve. Spin valve 400 includes antiferromagnetic pinning layer 410, synthetic antiferromagnet 420, spacer layer 430, free ferromagnetic layer 440 and antiferromagnetic exchange tabs 450 similar to those included in spin valve 200 illustrated in FIG. 2. Again, synthetic antiferromagnet 420 includes pinned layer 470, spacer layer 480 and reference layer 490 which are of similar materials and thicknesses to those discussed above. Also as discussed above, antiferromagnetic pinning layer 410 and antiferromagnetic exchange tabs 450 are preferably made of the same pinning material having the same blocking temperature.

The dual spin valve 400 differs from spin valve 200 in that it includes spacer layer 505 positioned on top of free layer 440, synthetic antiferromagnet 508 positioned on top of spacer layer 505 and antiferromagnetic pinning layer 525 positioned on top of synthetic antiferromagnet 508. As with the previous embodiments, reference layer 510 and pinned layer 520 of synthetic antiferromagnet 508 are separated by a spacer layer 515 and have substantially the same thicknesses. Likewise, antiferromagnetic pinning layer 525 is formed with the same material as exchange tabs 450 and pinning layer 410. Thus, during a single anneal in the presence of an external magnetic field $H_{ANNEAL}$ (in direction 498), the directions 492, 494, 496, 507 and 522 of the magnetic moments of layers 470, 490, 440, 510 and 520 can be established.

Figure 5:
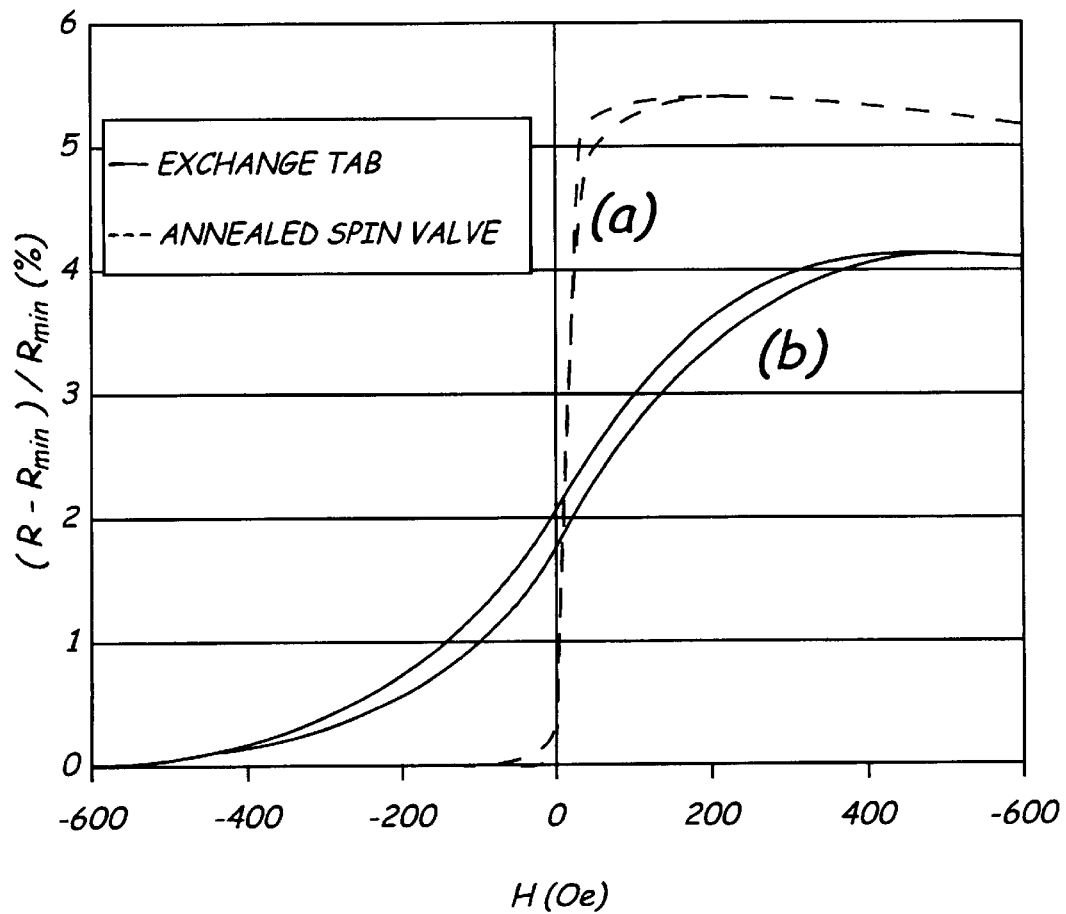
FIG. 5 is a plot of resistance change versus applied magnetic field for a bottom spin valve with and without exchange tab stabilization.

Two sheet film samples were prepared to demonstrate the methods of fabricating spin valve sensors of the present invention. The first sheet film was a bottom spin valve with a synthetic antiferromagnet pinned layer and with the upper most layer forming the free layer. The second sample was prepared under identical conditions, but with an extra layer of antiferromagnetic material deposited on to the free layer to act as the exchange tabs. The two samples were annealed once, together under identical conditions. The results show that the exchange tab sample is pinned along the applied field, while the bottom spin valve is pinned in a direction perpendicular to the applied field as shown in FIG. 5 which plots the resistance change versus applied magnetic field for these films. The sharp transition seen in the spin valve is broadened in the exchange tab sample. This is because the "free layer" is now biased by the overlaid antiferromagnetic exchange tabs. A fit to the data indicates the pinning field to be 223 Oe oriented within 3° of normal to the pinned layer. The anneal was repeated twice on the same sample, and the pinned layer showed no sign of rotation.

Figure 6:
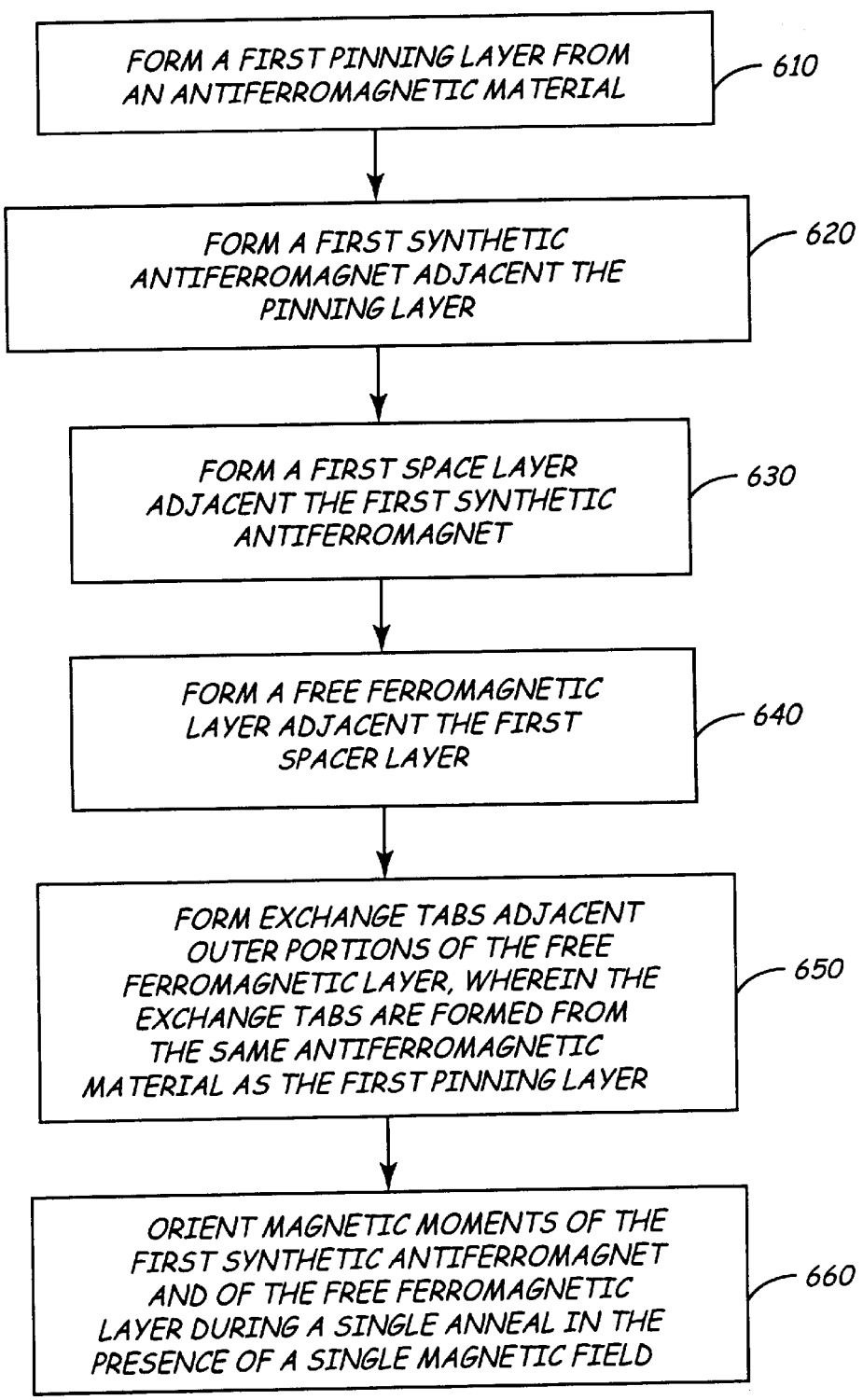
FIG. 6 is a flow diagram illustrating methods of fabricating spin valve sensors in accordance with the invention.

The methods of the present invention of fabricating spin valve sensors are illustrated in the flow diagram of FIG. 6. As illustrated at block 610 of FIG. 6, a first pinning layer is formed from an antiferromagnetic material. As shown at block 620, a first synthetic antiferromagnet is formed adjacent and in contact with the first pinning layer. At blocks 630 and 640, the method is shown to include forming a first spacer layer adjacent the first synthetic antiferromagnet and forming a free ferromagnetic layer adjacent the first spacer layer. At step 650, exchange tabs are formed adjacent outer portions of the free ferromagnetic layer for the purpose of biasing that layer. As illustrated at step 660, the magnetic moments of the first synthetic antiferromagnet and the magnetic moment of the free ferromagnetic layer are oriented (set or biased) during a thermal anneal in the presence of a single magnetic field.

These steps can be varied as described above to fabricate top spin valves, bottom spin valves and dual spin valves. Also, the steps should be interpreted in view of the previous discussion such that the pinned and reference layers of the synthetic antiferromagnet(s) are preferably of the same thickness. Also, the antiferromagnetic material used to form the exchange tabs and the first pinning layer are preferably the same as described previously. Obviously, the steps can be performed in the order necessary to fabricate the different types of spin valves, and additional steps can be added as needed.

Although the present invention has been described with reference to preferred embodiments, workers skilled in the art will recognize that changes may be made in form and detail without departing from the spirit and scope of the invention.

What is claimed is:

1. A spin valve magnetoresistive sensor comprising:
   a first pinning layer formed from an antiferromagnetic material;
   a first synthetic antiferromagnet adjacent and in contact with the pinning layer;
   a first spacer layer adjacent and in contact with the first synthetic antiferromagnet;
   a free ferromagnetic layer adjacent and in contact with the first spacer layer; and
   exchange tabs adjacent and in contact with outer portions of the free ferromagnetic layer, wherein the exchange tabs are formed from the same antiferromagnetic material as the first pinning layer.

2. The spin valve magnetoresistive sensor of claim 1, wherein the first synthetic antiferromagnet further comprises:
   a pinned ferromagnetic layer adjacent and in contact with the first pinning layer;
   a metal spacer layer adjacent and in contact with the pinned ferromagnetic layer; and
   a reference ferromagnetic layer adjacent and in contact with the metal spacer layer such that the reference ferromagnetic layer is positioned between the first spacer layer and the metal spacer layer.

3. The spin valve magnetoresistive sensor of claim 2, wherein the pinned ferromagnetic layer and the reference ferromagnetic layer of the first synthetic antiferromagnet have substantially the same thickness.

4. The spin valve magnetoresistive sensor of claim 3, wherein a magnetic moment of the pinned ferromagnetic layer is set in a first direction, wherein a magnetic moment of the reference ferromagnetic layer is set in a second direction antiparallel with the first direction, and wherein a magnetic moment of the free ferromagnetic layer is biased in a third direction perpendicular to the first and second directions.

5. The spin valve magnetoresistive sensor of claim 4, wherein the first synthetic antiferromagnet is formed on the first pinning layer, the first spacer layer is formed on the first synthetic antiferromagnet, the free ferromagnetic layer is formed on the first spacer layer and the exchange tabs are formed on the free ferromagnetic layer.

6. The spin valve magnetoresistive sensor of claim 5, and further comprising:
   a second spacer layer formed on a central portion of the free ferromagnetic layer between the exchange tabs;
   a second synthetic antiferromagnet formed on the second spacer layer; and
   a second pinning layer formed on top of the second synthetic antiferromagnet, wherein the second pinning layer is formed from the same antiferromagnetic material as the first pinning layer and the exchange tabs.

7. The spin valve magnetoresistive sensor of claim 4, wherein the free ferromagnetic layer is formed partially on the exchange tabs, the first spacer layer is formed on the free layer, the first synthetic antiferromagnet is formed on the first spacer layer, and the first pinning layer is formed on the first synthetic antiferromagnet.

8. A disc drive storage system including the spin valve magnetoresistive sensor of claim 1 positioned adjacent a disc surface.

9. A spin valve magnetoresistive sensor comprising:
   a pinning layer formed of a first antiferromagnetic material;
   a synthetic antiferromagnet adjacent and in contact with the pinning layer, including:
      a pinned ferromagnetic layer adjacent and in contact with the pinning layer;
      a metal spacer layer adjacent and in contact with the pinned ferromagnetic layer; and
      a reference ferromagnetic layer adjacent and in contact with the metal spacer layer, wherein the pinned ferromagnetic layer and the reference ferromagnetic layer of the synthetic antiferromagnet have substantially the same thickness;
   a spacer layer adjacent and in contact with the synthetic antiferromagnetic such that the reference ferromagnetic layer is positioned between the spacer layer and metal spacer layer;
   a free ferromagnetic layer adjacent and in contact with the spacer layer; and
   exchange tabs also formed of the first antiferromagnetic material, and positioned adjacent and in contact with outer portions of the free ferromagnetic layer.

10. The spin valve magnetoresistive sensor of claim 9, wherein a magnetic moment of the pinned ferromagnetic layer is set in a first direction, wherein a magnetic moment of the reference ferromagnetic layer is set in a second direction antiparallel with the first direction, and wherein a magnetic moment of the free ferromagnetic layer is biased in a third direction perpendicular to the first and second directions.

11. The spin valve magnetoresistive sensor of claim 10, wherein the synthetic antiferromagnet is formed on the pinning layer, the spacer layer is formed on the synthetic antiferromagnet, the free ferromagnetic layer is formed on the spacer layer and the exchange tabs are formed on the free ferromagnetic layer.

12. The spin valve magnetoresistive sensor of claim 11 and further comprising:
   a second spacer layer formed on a central portion of the free ferromagnetic layer between the exchange tabs;
   a second synthetic antiferromagnet formed on the second spacer layer; and
   a second pinning layer formed on top of the second synthetic antiferromagnetic, wherein the second pinning layer is also formed from the first antiferromagnetic material.

13. The spin valve magnetoresistive sensor of claim 10, wherein the free ferromagnetic layer is formed partially on the exchange tabs, the spacer layer is formed on the free ferromagnetic layer, the synthetic antiferromagnet is formed on the spacer layer, and the pinning layer is formed on the synthetic antiferromagnetic.

14. A disc drive storage system including the spin valve magnetoresistive sensor of claim 9 positioned adjacent a disc surface.

15. A spin valve magnetoresistive sensor, comprising:
   a synthetic antiferromagnet having first and second antiferromagnetic layers with respective first and second magnetic moments;
   a free ferromagnetic layer having a third magnetic moment; and
   orienting means for orienting the first and second magnetic moments antiparallel to one another and for biasing the third magnetic moment perpendicular to the first and the second magnetic moments with a single antiferromagnetic material.

16. The spin valve magnetoresistive sensor of claim 15, wherein the orienting means further comprise an antiferromagnetic pinning layer adjacent and in contact with the synthetic antiferromagnet and antiferromagnetic exchange tabs adjacent and in contact with the free ferromagnetic layer.

17. The spin valve magnetoresistive sensor of claim 16, wherein the antiferromagnetic pinning layer and the antiferromagnetic exchange tabs are formed of the same antiferromagnetic material.

18. The spin valve magnetoresistive sensor of claim 17, wherein the first and second ferromagnetic layers of the synthetic antiferromagnet have substantially the same thickness.

* * * * *